(12) United States Patent
Albrecht et al.

(10) Patent No.: US 7,693,201 B2
(45) Date of Patent: Apr. 6, 2010

(54) LIGHT-EMITTING SEMICONDUCTOR COMPONENT COMPRISING A PROTECTIVE DIODE

(75) Inventors: Tony Albrecht, Bad Abbach (DE); Peter Brick, Regensburg (DE); Marc Philippens, Regensburg (DE); Glenn-Yves Plaine, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 42 days.

(21) Appl. No.: 10/580,969

(22) PCT Filed: Oct. 26, 2004

(86) PCT No.: PCT/DE2004/002384

§ 371 (c)(1),
(2), (4) Date: Feb. 26, 2007

(87) PCT Pub. No.: WO2005/055379

PCT Pub. Date: Jun. 16, 2005

(65) Prior Publication Data

US 2007/0258500 A1 Nov. 8, 2007

(30) Foreign Application Priority Data

Nov. 28, 2003 (DE) .................. 103 56 283
Feb. 3, 2004 (DE) ................. 10 2004 005 269

(51) Int. Cl.
*H01S 5/183* (2006.01)
*H01S 5/125* (2006.01)

(52) U.S. Cl. ............... 372/50.1; 372/50.11; 257/79; 257/98; 257/99; 257/E27.12

(58) Field of Classification Search ............ 257/E27.12, 257/79, 98, 99; 372/50.1, 50.11, 50.12, 50.121, 372/50.122, 50.123, 50.124, 50.21, 50.22, 372/50.23

See application file for complete search history.

(56) References Cited

U.S. PATENT DOCUMENTS 5,757,836 A * 5/1998 Jiang et al. ............... 372/50.21

(Continued)

FOREIGN PATENT DOCUMENTS

DE         199 45 134 A1     5/2001

(Continued)

*Primary Examiner*—Kiesha R. Bryant
*Assistant Examiner*—Eric Ward
(74) *Attorney, Agent, or Firm*—Cohen Pontani Lieberman & Pavane LLP

(57) ABSTRACT

A light-emitting semiconductor component which contains a sequence of semiconductor layers (2) with an area of p-doped semiconductor layers (4) and n-doped semiconductor layers (3) between which a first pn junction (5a, 5b) is formed. The pn junction (5a, 5b) is subdivided into a light-emitting section (7) and a protective-diode section (8) in a lateral direction by means of an insulating section (6). An n-doped layer (9), which forms a second pn junction (10) which acts as a protective diode along with the p-doped area (4), is applied to the p-doped area (4) in the area of the protective-diode section (8), the first pn junction (5b) in the protective-diode section (8) having a larger area than the first pn junction (5a) in the light-emitting section (7). The protective-diode section (8) protects the light-emitting semiconductor component from voltage pulses due to electrostatic discharges (ESD).

18 Claims, 1 Drawing Sheet

U.S. PATENT DOCUMENTS

| | | | |
|---|---|---|---|
| 6,185,240 B1 * | 2/2001 | Jiang et al. | 372/50.124 |
| 6,639,931 B1 * | 10/2003 | Dowd et al. | 372/96 |
| 7,173,311 B2 * | 2/2007 | Sato et al. | 257/355 |
| 7,483,464 B2 * | 1/2009 | Kuwata et al. | 372/50.1 |
| 7,508,047 B2 * | 3/2009 | Tatum et al. | 257/462 |
| 2006/0023762 A1 * | 2/2006 | Nishida et al. | 372/43.01 |
| 2006/0280218 A1 * | 12/2006 | Kaneko et al. | 372/81 |
| 2008/0308823 A1 * | 12/2008 | Kamii et al. | 257/94 |

FOREIGN PATENT DOCUMENTS

| | | | |
|---|---|---|---|
| JP | 57 093591 A | | 6/1982 |
| JP | 57093591 A | * | 6/1982 |
| JP | 59 019389 A | | 1/1984 |
| JP | 09 027651 A | | 1/1997 |
| JP | 09 027657 A | | 1/1997 |
| JP | 10 200159 A | | 7/1998 |
| JP | 2000 312033 A | | 11/2000 |

* cited by examiner

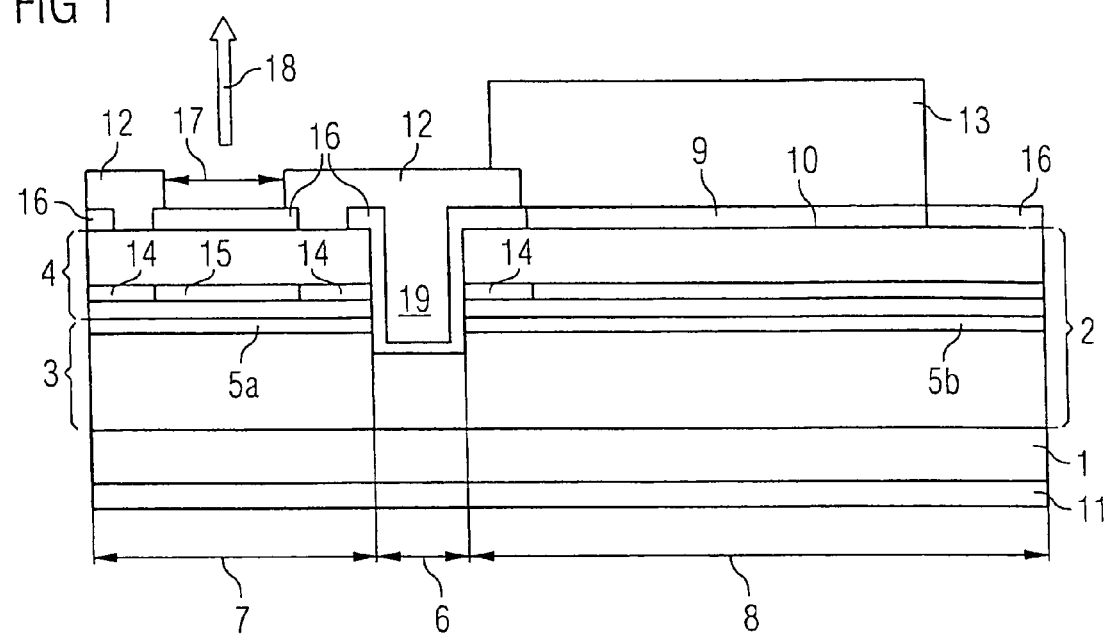
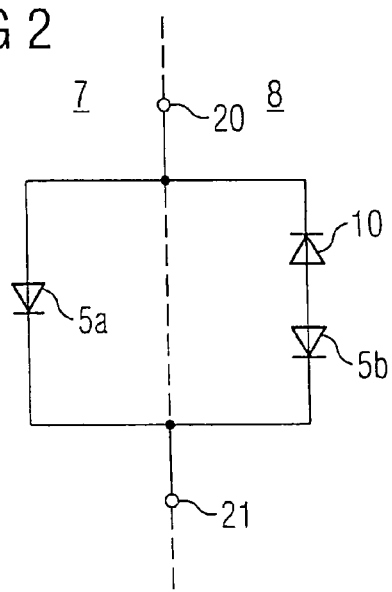

LIGHT-EMITTING SEMICONDUCTOR COMPONENT COMPRISING A PROTECTIVE DIODE

RELATED APPLICATIONS

This is a U.S. national stage of application No. PCT/DE2004/002384, filed on 26 Oct. 2004.

This patent application claims the priority of German patent application nos. 103 56 283.4 and 10 2004 005269.7 filed Nov. 28, 2003 and Feb. 3, 2004 respectively, the disclosure content of which is hereby incorporated by reference.

FIELD OF THE INVENTION

The invention relates to a light-emitting semiconductor component wherein the area of the p-doped semiconductor layers is provided in the protective-diode section on the side facing away from the first pn junction with an n-doped semiconductor layer which forms a second pn junction with the area of p-doped semiconductor layers in the protective-diode section and is electrically conductively connected to the area of p-doped semiconductor layers in the light-emitting section, and wherein the first pn junction has a larger area in the protective-diode section than in the light-emitting section.

BACKGROUND OF THE INVENTION

The increasing miniaturization of opto-electronic components and special requirements, particularly with regard to the threshold current and the radiation quality, lead to the radiation-emitting active area of such components frequently being constructed to be relatively small. On the other hand, it is known that a relatively small active area produces increased sensitivity of the component to electrostatic discharges (ESD). Such ESD voltage pulses can impair the operation of an opto-electronic component or even destroy it.

From U.S. Pat. No. 6,185,240 B1, a vertical cavity surface emitting laser (VCSEL) is known which contains a protective diode integrated monolithically on the semiconductor substrate for increasing its ESD resistance. This protective diode is connected in antiparallel with the VCSEL by means of a multi-stage etching process and suitable running of the contact metallizations and in this manner protects the VCSEL from ESD voltage pulses which occur in the reverse direction of the pn junction of the VCSEL.

A further radiation-emitting semiconductor component with improved ESD immunity is known from DE 199 45 134 A1. In this component, a monolithically integrated protective diode is implemented by providing a part of the pn junction with a Schottky contact. The part-section provided with the Schottky contact is connected in parallel with the light-emitting section and has the same forward direction. Due to a steeper current/voltage characteristic, the current preferably flows through the protective-diode section at high voltages in the forward direction. In this manner, this component is protected against ESD voltage pulses in the forward direction.

SUMMARY OF THE INVENTION

One object of the present invention is to provide a light-emitting semiconductor component which is distinguished by an improved protection against ESD voltage pulses in the reverse direction of the light-emitting pn junction and can be produced with relatively little expenditure.

According to the invention, a light-emitting semiconductor component contains a monolithically produced sequence of semiconductor layers, wherein an area of n-doped semiconductor layers and an area of p-doped semiconductor layers follow one another and a first pn junction is formed between the areas, the first pn junction being subdivided into a light-emitting section and a protective-diode section by an insulating section. The insulating section electrically insulates the light-emitting section and the protective-diode section from one another in the area of the p-doped semiconductor layers wherein the area of the p-doped semiconductor layers is provided in the protective-diode section on the side facing away from the first pn junction with an n-doped semiconductor layer which forms a second pn junction with the area of p-doped semiconductor layers in the protective-diode section and is electrically conductively connected to the area of p-doped semiconductor layers in the light-emitting section, and wherein the first pn junction has a larger area in the protective-diode section than in the light-emitting section.

Accordingly, a first pn junction and a second pn junction are connected in series with opposite polarity in the protective-diode section. These series-connected pn junctions in turn are connected in parallel with the pn junction of the light-emitting section. In the case of a voltage applied in the forward direction of the first pn junction, for example the operating voltage of the light-emitting component, the second pn junction is polarized in the reverse direction in the protective-diode section. The current therefore essentially only flows through the light-emitting section.

If, in contrast, a voltage is applied to the semiconductor component in the reverse direction of the first pn junction, the second pn junction is polarized in the forward direction in the protective-diode section. In this case, the first pn junction is polarized in the reverse direction both in the light-emitting section and in the protective-diode section. In the case of an ESD voltage pulse in the reverse direction which exceeds a breakdown voltage of the first pn junction, the current preferably flows through the protective-diode section since the latter has a larger area than the light-emitting section. As a result, the risk of damage or destruction of the first pn junction, which is particularly sensitive due to its small area, in the light-emitting section is advantageously reduced.

In the context of the invention, the area of the first pn junction in the protective-diode section and in the light-emitting section, respectively, is understood to be the area available for a current flow between electrical contacts of the component in the plane of the boundary face between the p-doped area and the n-doped area of the first pn junction. When these areas are determined, area components should not be taken into consideration through which a current flow is prevented, for example due to insulating areas provided for spatial current limiting in the sequence of semiconductor layers.

The area of the first pn junction is preferably larger in the protective-diode section than in the light-emitting section at least by a factor of 100. In this case, the current essentially flows through the protective-diode section in the case of an ESD voltage pulse.

An advantage of the light-emitting semiconductor component according to the invention consists in that the layer structure can be produced relatively simply. For example, no etching processes are required which extend from the surface of the sequence of semiconductor layers to the surface of the substrate since the light-emitting section and the protective-diode section only need to be insulated from one another in the area of the p-doped semiconductor layers.

The emission wavelength of the light-emitting semiconductor component is not restricted to the visible spectral range in the invention. In particular, the emission can also take place in the infrared or ultraviolet spectral range.

The sequence of semiconductor layers is applied, for example, to a semiconductor substrate. However, it is also possible that a growth substrate originally used for growing the sequence of semiconductor layers is detached. For the purpose of contacting the light-emitting component, a first contact metallization is applied to a side of the semiconductor substrate facing away from the sequence of semiconductor layers and a second contact metallization is applied to part-areas of the surface of the light-emitting section opposite to the semiconductor substrate, for example.

The insulating section extends, for example, from the top of the sequence of semiconductor layers into the area of the n-doped layers. The n-doped areas of the light-emitting section and of the protective-diode section are thus not interrupted by the insulating section, at least in parts.

The light-emitting section can be formed, in particular, by a vertical cavity surface emitting laser (VCSEL). The laser resonator of the VCSEL is formed, for example, from a first sequence of Bragg reflector layers and a second sequence of Bragg reflector layers, each of which has a multiplicity of layer pairs, the first pn junction being arranged between the two Bragg reflectors and one of the two Bragg reflectors being semitransparent for the laser radiation generated in the pn junction.

Preferably, at least one current aperture, by means of which the current flowing through the active area of the light-emitting section is spatially limited, is provided in one of the two sequences of Bragg reflector layers. Applying this measure, in particular, the beam cross section can be narrowed and the threshold current density can be reduced.

The insulating section is constructed, for example, as a trench so that the light-emitting section and the protective-diode section have a mesa-shaped structure on the side of the trench. The trench is produced, for example, by an etching process or by mechanical microstructuring. The inside of the trench is advantageously provided with an insulating layer. The second contact metallization can be applied after the generation of the trench in this case and the trench can be filled up with the material of the second contact metallization without the trench losing its insulating effect.

BRIEF DESCRIPTION OF THE DRAWINGS

FIG. 1 shows a diagrammatic cross section through a light-emitting semiconductor component according to the invention; and FIG. 2 shows an equivalent circuit of the semiconductor component shown in FIG. 1.

DETAILED DESCRIPTION OF THE DRAWINGS

The light-emitting semiconductor component shown in FIG. 1 is a vertical cavity surface emitting laser (VCSEL). The VCSEL contains a substrate 1 to which is applied a sequence of semiconductor layers 2. The sequence of semiconductor layers 2 contains an area of n-doped layers 3 and an area of p-doped semiconductor layers 4 between which a first pn junction 5a, 5b is formed. The pn junction 5a, 5b is subdivided into a light-emitting section 7 and a protective-diode section 8 by an insulating section 6. The area of the first pn junction 5b in the protective-diode section 8 is larger, preferably larger by more than a factor of 100, than the area of the first pn junction 5a in the light-emitting section 7.

The pn junction 5a in the light-emitting section 7 represents the active zone of the VCSEL. The area of n-doped semiconductor layers 3 and the area of p-doped semiconductor layers 4 contain Bragg reflectors which in each case contain a multiplicity of reflecting layer pairs (not shown). The Bragg reflectors form the laser resonator of the VCSEL. The Bragg reflector facing the surface of the VCSEL in the area of the p-doped semiconductor layers 4 is constructed to be semi-transparent for coupling out the laser radiation 18.

The electrical contacting of the VCSEL is implemented by a first contact metallization 11 on the side of the substrate 1 facing away from the sequence of semiconductor layers 2 and a second contact metallization 12 on the surface of the sequence of semiconductor layers 2. The surface of the light-emitting section 7 is only partially covered by the second contact metallization 12, leaving a light exit opening 17. The surface of the light-emitting section 7 in this area is preferably provided with an insulating layer 16 which protects the surfaces of the semiconductor layers, in particular, against oxidation or other environmental influences.

The current flowing through the light-emitting section 7 is advantageously limited to a central area 15 by a current aperture 14. The current aperture 14 can be constructed, in particular, in the area of the p-doped semiconductor layers 4. For example, a semiconductor layer containing aluminum, particularly AlAs, in which part-areas 14 are oxidized, exists in this area 4. The oxidized areas 14 act in an insulating manner so that the current flow is restricted to a central area 15. A current aperture 14 can also exist in the protective-diode section 8. Although it is not desirable to limit the area available for the current flow in this section, a production of the current aperture on both sides of the trench 19 can simplify the production process. In this case, the area of the current aperture 14 should be much larger in the protective-diode section 8 than in the light-emitting section 7.

The insulating section 6 is constructed, for example, as a trench 19 which extends from the surface of the semiconductor layers 2 into the area of the n-doped semiconductor layers 3. The p-doped areas 4 of the light-emitting section 7 and of the protective-diode section 8 are separated from one another and electrically insulated by the trench 19. The area of n-doped semiconductor layers 3, in contrast, is only partially interrupted by the trench 19, or it is not interrupted at all, so that the light-emitting section 7 and the protective-diode section 8 are electrically connected to one another in this area. The trench 19 forming the insulating section 6 can be produced, for example, by an etching process or mechanical machining. On its inside, the trench 19 is advantageously provided with an insulating layer 16. This ensures that when the second contact metallization 12 is applied, no short circuit occurs between the light-emitting section 7 and the protective-diode section 8. Before the insulating layer 16 is applied, the current apertures 14 can be produced from the inside of the trench 19 by an oxidation process.

Instead of constructing the insulating section 6 as trench 19, it is also possible, as an alternative, that the insulating section 6 is produced by implantation or diffusion of foreign matter into the sequence of semiconductor layers 2 or by oxidation of a part of the sequence of semiconductor layers 2.

In the area of the protective-diode section 8, an n-doped semiconductor layer 9 is applied to the surface of the area of the p-doped semiconductor layers 4. Between these, a second pn junction 10 is formed. To the n-doped semiconductor layer 9, a bond pad 13 provided for the electrical contacting of the VCSEL is applied which is connected electrically conductively to the second contact metallization 12. In the area of the protective-diode section 8, the first pn junction 5b and the second pn junction 10 are connected in series. The light-emitting section 7 and the protective-diode section 8 are connected in parallel by means of the first contact metallization 11 and the second contact metallization 12 or the bond pad 13, respectively.

This is illustrated by the equivalent circuit shown in FIG. 2. The left-hand side of the equivalent circuit corresponds to the light-emitting section 7 and the right-hand side to the protective-diode section 8. The light-emitting section 7 only contains the first pn junction 5a. This is also contained in the protective-diode section 8 but the second pn junction 10 is connected in series with it in opposite polarity.

When the VCSEL is operated, the operating voltage is present at the contacts 20, 21 in the forward direction of the first pn junction 5a, 5b. The second pn junction 10 in the protective-diode section 8 is polarized in the reverse direction in this case so that the current essentially only flows through the light-emitting section 7. In the case of an ESD voltage pulse in the reverse direction of the first pn junction 5a, 5b, the second pn junction 10 is polarized in the forward direction, in contrast, so that the electrical resistance of the protective-diode section 8 is essentially determined by the resistance of the first pn junction 5b. Since the area of the first pn junction 5b in the protective-diode section 8 is larger than the area of the first pn junction 5a in the light-emitting section 7, a reverse current caused by the voltage pulse essentially flows through the first pn junction 5b in the protective-diode section 8. As a result, the first pn junction 5a in the light-emitting section 7, provided for generating radiation, is protected from damage by the voltage pulse. The greater the ratio of the area of the first pn junction (5a, 5b) in the protective-diode section 8 to the area in the light-emitting section 7, the better the protective effect.

The first pn junction 5b in the area of the protective-diode section 8 can be short circuited in a further embodiment of the invention. This is possible, for example, due to an electrically conductive layer (not shown in FIG. 1) which is applied to a side edge of the sequence of semiconductor layers 2 facing the protective-diode section 8 and electrically connects the area of n-doped semiconductor layers 3 and the area of p-doped semiconductor layers with one another. In this embodiment, in the case of an ESD voltage pulse in the reverse direction, the current does not flow through the first pn junction 5b but through the electrically conductive layer and the second pn junction 10. In consequence, this embodiment does not require the area of the first pn junction 5b in the protective-diode section 8 to be larger than the area of the first pn junction 5a in the light-emitting section 7.

In the context of the invention, it is possible for the specified conduction types p and n of the semiconductor layers to be exchanged with one another in each case. In this case, all conduction types p and n mentioned in the description are to be considered to be exchanged with one another.

Naturally, the explanation of the invention by means of the exemplary embodiment must not be considered as a restriction to the latter. Instead, the invention includes the features disclosed, both individually and in any combination with one another even if these combinations have not been specified explicitly in the claims.

The invention claimed is:

1. A light-emitting semiconductor component comprising a monolithically produced sequence of semiconductor layers, which comprise:
    an area of n-doped semiconductor layers;
    an area of p-doped semiconductor layers following the area of n-doped semiconductor layers;
    a first pn junction formed between the areas;
    an insulating section dividing the first pn junction into a light-emitting section and a protective-diode section; and
    an n-doped semiconductor provided in the protective-diode section on a side of the area of p-doped semiconductor layers facing away from the first pn junction;
    wherein the first pn junction in the area of the protective-diode section is short circuited,
    wherein the insulating section is constructed as a trench bounded by an insulating layer, whereby the insulating section electrically insulates the light-emitting section and the protective-diode section from one another in the area of p-doped semiconductor layers,
    wherein the trench is filled with a material forming a contact metallization, and
    wherein the n-doped semiconductor portion forms a second pn junction with a first portion of the area of p-doped semiconductor layers in the protective-diode section and is electrically conductively connected to a second portion of the area of p-doped semiconductor layers in the light-emitting section.

2. A light-emitting semiconductor component comprising a monolithically produced sequence of semiconductor layers, which comprise:
    an area of n-doped semiconductor layers;
    an area of p-doped semiconductor layers following the area of n-doped semiconductor layers;
    a first pn junction formed between the areas;
    an insulating section dividing the first pn junction into a light-emitting section and a protective-diode section, wherein the insulating section electrically insulates the light-emitting section and the protective-diode section from one another in the area of p-doped semiconductor layers,
    an n-doped semiconductor provided in the protective-diode section on a side of the area of p-doped semiconductor layers facing away from the first pn junction, wherein the n-doped semiconductor portion forms a second pn junction with a first portion of the area of p-doped semiconductor layers in the protective-diode section and is electrically conductively connected to a second portion of the area of p-doped semiconductor layers in the light-emitting section, and
    wherein the first pn junction in the area of the protective-diode section is short circuited.

3. The light-emitting semiconductor component as claimed in claim 2, wherein an electrically conductive layer is applied to a side edge of the sequence of semiconductor layers facing the protective-diode section and electrically connects the area of n-doped semiconductor layers and the area of p-doped semiconductor layers with one another.

4. A light-emitting semiconductor component comprising a monolithically produced sequence of semiconductor layers, which comprise:
    an area of p-doped semiconductor layers;
    an area of n-doped semiconductor layers following the area of p-doped semiconductor layers;
    a first pn junction formed between the p-doped area and the n-doped area;
    an insulating section dividing the first pn junction into a light-emitting section and a protective-diode section, wherein the insulating section electrically insulates the light-emitting section and the protective-diode section from one another in the area of n-doped semiconductor layers, and a p-doped semiconductor portion provided in the protective-diode section and on a side of the area of n-doped semiconductor layers facing away from the first pn junction, wherein the p-doped semiconductor portion forms a second pn junction with a first portion of the area of n-doped semiconductor layers in the protective-diode section and is electrically conductively connected to a second portion of the area of n-doped semiconductor layers in the light-emitting section, and wherein the first pn junction has a larger area in the protective-diode section than in the light-emitting section by at least a factor of 100.

5. A light-emitting semiconductor component comprising a monolithically produced sequence of semiconductor layers, which comprise:

an area of n-doped semiconductor layers;

an area of p-doped semiconductor layers following the area of n-doped semiconductor layers;

a first pn junction formed between the n-doped area and the p-doped area;

an insulating section dividing the first pn junction into a light-emitting section and a protective-diode section, wherein the insulating section electrically insulates the light-emitting section and the protective-diode section from one another in the area of p-doped semiconductor layers, and an n-doped semiconductor portion provided in the protective-diode section and on a side of the area of p-doped semiconductor layers facing away from the first pn junction, wherein the n-doped semiconductor portion forms a second pn junction with a first portion of the area of p-doped semiconductor layers in the protective-diode section and is electrically conductively connected to a second portion of the area of p-doped semiconductor layers in the light-emitting section, and wherein the first pn junction has a larger area in the protective-diode section than in the light-emitting section by at least a factor of 100.

6. The light-emitting semiconductor component as claimed in claim 5, wherein the sequence of semiconductor layers is applied to a semiconductor substrate.

7. The light-emitting semiconductor component as claimed in claim 6, further comprising a first contact metallization applied to a side of the semiconductor substrate facing away from the sequence of semiconductor layers, and a second contact metallization applied to a surface of the sequence of semiconductor layers opposite to the semiconductor substrate.

8. The light-emitting semiconductor component as claimed in claim 5, wherein the area of n-doped semiconductor layers is only partially interrupted by the insulating section or is not interrupted at all.

9. The light-emitting semiconductor component as claimed in claim 6, wherein the insulating section extends from a surface of the sequence of semiconductor layers opposite to the semiconductor substrate into the area of n-doped semiconductor layers.

10. The light-emitting semiconductor component as claimed in claim 5, wherein the light-emitting section is formed by a vertical cavity surface emitting laser (VCSEL).

11. The light-emitting semiconductor component as claimed in claim 10, wherein the first pn junction is arranged between a first sequence of Bragg reflector layers and a second sequence of Bragg reflector layers, and wherein each of the first and second sequences has a multiplicity of layer pairs, and the two sequences of Bragg reflector layers form a laser resonator, one of the two sequences of the Bragg reflector layers being semitransparent for a laser radiation generated in the first pn junction.

12. The light-emitting semiconductor component as claimed in claim 11, wherein in one of the two sequences of Bragg reflector layers, at least one current aperture is provided for spatially limiting an operating current flowing through the first pn junction in the light-emitting section during operation of the vertical cavity surface emitting laser.

13. The light-emitting semiconductor component as claimed in claim 7, wherein the second contact metallization partially covers a surface of the light-emitting section in such a manner that an uncovered area of the light-emitting section remains as light exit opening.

14. The light-emitting semiconductor component as claimed in claim 5, wherein the insulating section is constructed as a trench.

15. The light-emitting semiconductor component as claimed in claim 14, wherein the light-emitting section and the protective-diode section have a mesa-shaped structure on a side of the trench.

16. The light-emitting semiconductor component as claimed in claim 14, wherein the trench is bounded by areas which are provided with an insulating layer.

17. The light-emitting semiconductor component as claimed in claim 7, wherein the trench is filled with a material from which the second contact metallization is formed.

18. The light-emitting semiconductor component as claimed in claim 5, wherein the insulating section is formed by an implantation, diffusion or oxidation process.

* * * * *